(12) United States Patent
Chen

(10) Patent No.: US 11,296,061 B2
(45) Date of Patent: Apr. 5, 2022

(54) MICRO SEMICONDUCTOR STACKED STRUCTURE AND ELECTRONIC APPARATUS HAVING THE SAME

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 89 days.

(21) Appl. No.: 16/864,753

(22) Filed: May 1, 2020

(65) Prior Publication Data

US 2020/0350298 A1    Nov. 5, 2020

(30) Foreign Application Priority Data

May 3, 2019    (TW) .................................. 108115347

(51) Int. Cl.
| | |
|---|---|
| H01L 25/075 | (2006.01) |
| H01L 33/24 | (2010.01) |
| H01L 27/15 | (2006.01) |
| H01L 33/62 | (2010.01) |

(52) U.S. Cl.
CPC ........ H01L 25/0756 (2013.01); H01L 27/156 (2013.01); H01L 33/24 (2013.01); H01L 33/62 (2013.01)

(58) Field of Classification Search
CPC ... H01L 25/0756; H01L 27/156; H01L 33/24; H01L 33/62; H01L 27/15; H01L 25/0652; H01L 25/0753; H01L 31/02005
See application file for complete search history.

(56) References Cited

U.S. PATENT DOCUMENTS

| | | | |
|---|---|---|---|
| 2014/0209936 A1* | 7/2014 | Oraw ................... | H01L 25/0756 257/88 |
| 2015/0357315 A1* | 12/2015 | Oraw ....................... | G09G 3/32 315/294 |
| 2019/0165038 A1* | 5/2019 | Chae ....................... | H01L 33/10 |
| 2019/0165207 A1* | 5/2019 | Kim ......................... | H01L 33/505 |
| 2019/0198485 A1* | 6/2019 | Chae ....................... | H01L 33/405 |
| 2019/0198565 A1* | 6/2019 | Lee ......................... | H01L 27/156 |
| 2019/0206849 A1* | 7/2019 | Jang ...................... | H01L 25/0756 |
| 2019/0206927 A1* | 7/2019 | Lee ....................... | H01L 25/0756 |
| 2019/0318957 A1* | 10/2019 | Godet ..................... | H01L 25/167 |
| 2020/0266233 A1* | 8/2020 | Iguchi ...................... | H01L 33/06 |
| 2021/0013367 A1* | 1/2021 | Wu ...................... | H01L 33/0075 |
| 2021/0202616 A1* | 7/2021 | Zhang .................... | G09G 3/32 |

FOREIGN PATENT DOCUMENTS

| | | | | |
|---|---|---|---|---|
| WO | WO-2018064805 A1 * | 4/2018 | ............... | G09F 9/33 |
| WO | WO-2018175338 A1 * | 9/2018 | ............... | G09G 3/22 |

* cited by examiner

*Primary Examiner* — Victor A Mandala

(74) *Attorney, Agent, or Firm* — Muncy, Geissler, Olds & Lowe, P.C.

(57) ABSTRACT

A micro semiconductor stacked structure includes at least two stacked structure array units, wherein one stacked structure array unit is stacked on the other stacked structure array unit. In particular, the stacked structure array unit is stacked on the other stacked structure array unit along a vertical direction. Each stacked structure array unit includes a substrate, a conductive pattern layer disposed on the substrate, and a plurality of micro semiconductor devices disposed on the substrate and electrically connected to the conductive pattern layer.

19 Claims, 10 Drawing Sheets

MICRO SEMICONDUCTOR STACKED STRUCTURE AND ELECTRONIC APPARATUS HAVING THE SAME

CROSS REFERENCE TO RELATED APPLICATIONS

This Non-provisional application claims priority under 35 U.S.C. § 119(a) on Patent Application No(s). 108115347 filed in Taiwan, Republic of China on May 3, 2019, the entire contents of which are hereby incorporated by reference.

BACKGROUND

Technology Field

The present disclosure relates to an electronic apparatus and, in particular, to an electronic apparatus composed of micro semiconductor stacked structure array(s).

Description of Related Art

Generally, semiconductor arrays are arranged along a plane. Under the requirements of smaller devices, the manufacturing processes are continuously improved to achieve smaller line widths and dimensions. However, due to the balance between cost and equipment investment in the industry, the advancement of the minimum line width has slowed down.

Taking micro LED display technology as an example, as shown in FIG. 1, three micro LEDs (red, green and blue light) configures three sub-pixels 110a, 120a, 130a, respectively, which are arranged adjacent to each other on a plane to form a pixel 100a. An array composed of a plurality of pixels 100a constitute a display 200a. In this case, the three micro LEDs have the same size. Each micro LED has a length L and a width W. The unit area of the pixel 100a is limited by the total width 3W of the assembled sub-pixels. The pixel width P is slightly larger than 3W, and the pixel area P*P is slightly larger than 3W*3W. With the pursuit of high resolution (more pixels in a limited area), the length and width of pixels have been reduced to the micron level. Even so, the manufacturers still suffer from cost and technical bottlenecks, and a new solution is desired for the industry.

SUMMARY

In view of the foregoing, this disclosure provides a micro semiconductor stacked structure and an electronic apparatus having the same, wherein the minimum unit area of the micro semiconductor stacked structure can be decreased and the density of the micro semiconductor stacked structures disposed in the limited area inside the electronic apparatus can be reduced.

In view of the foregoing, this disclosure provides a semiconductor stacked structure and an electronic apparatus having the same, which can achieve low cost and high resolution within the limited area inside the electronic apparatus.

A micro semiconductor stacked structure comprises at least two stacked structures, wherein one of the stacked structures is stacked on the other one of the stacked structures. The one of the stacked structures is stacked on the other one of the stacked structures along a vertical direction. Each of the stacked structures comprises a substrate, a conductive pattern layer disposed on the substrate, and one or more micro semiconductor devices disposed on the substrate and electrically connected to the conductive pattern layer. Each of the stacked structures defines a target region, and the micro semiconductor device of each stacked structure is disposed in the target region. Between two of the stacked structures, the target regions are aligned along the vertical direction, and in at least one of the stacked structures, the conductive pattern layer is an active circuit.

A micro semiconductor stacked structure comprises three stacked structures, wherein two stacked structures are stacked on the bottommost stacked structure. The two stacked structures are stacked on the bottommost stacked structure along a vertical direction. Each of the stacked structures comprises a substrate, a conductive pattern layer disposed on the substrate, and at least one micro LED chip disposed on the substrate and electrically connected to the conductive pattern layer. Each of the stacked structures defines a pixel, and at least one micro LED chip of each stacked structure is disposed in the pixel. Between two of the stacked structures, the target regions are aligned along the vertical direction, and in at least one of the three stacked structures, the conductive pattern layer is an active circuit.

In some embodiments, the micro semiconductor stacked structure further comprises at least one stair portion, which is formed based on sizes of the substrates decreasing sequentially along a direction toward an upper one of the stacked structures or away from a lower one of the stacked structures.

In some embodiments, the conductive pattern layers of the two of the stacked structures are connected by an electronic connecting member.

In some embodiments, the at least one stair portion comprises an electronic connecting member, and the conductive pattern layers of the two of the stacked structures are connected by the electronic connecting member.

In some embodiments, a size of the micro semiconductor device is 1-50 µm. In some embodiments, a size of the micro LED chip is 1-50 µm.

In some embodiments, the substrates of the stacked structures are transparent; or the substrate of the bottommost stacked structure is nontransparent.

In some embodiments, the substrate is a rigid substrate, a flexible substrate, or a dielectric layer formed by a semiconductor coating process.

In some embodiments, the conductive pattern layer of the bottommost stacked structure is an active circuit configured with a TFT switch or a MOS switch.

In some embodiments, the micro semiconductor device of each of the stacked structures is a micro LED chip, a micrometer photo detector chip, or a combination thereof.

In some embodiments, the micro semiconductor devices of the three stacked structures are a red micro LED chip, a green micro LED chip and a blue micro LED chip arranged in order along the direction toward the upper stacked structure or away from the lower stacked structure, and the light output sides of the micro LED chips are disposed close to the upper stacked structure or away from the lower stacked structure.

In some embodiments, the two of the stacked structures are bonded by an adhesive material.

In some embodiments, the adhesive material performs a planarization of the lower stacked structure.

A micro semiconductor stacked structure comprises at least two stacked structure array units, wherein one of the stacked structure array units is stacked on the other one of the stacked structure array units. The one of the stacked structure array units is stacked on the other one of the stacked structure array units along a vertical direction. Each of the stacked structure array units comprises a substrate, a conductive pattern layer disposed on the substrate, and a plurality of micro semiconductor devices disposed on the substrate, arranged in an array, and electrically connected to the conductive pattern layer. Each of the conductive pattern layers comprises a matrix circuit, and the micro semiconductor devices are electrically connected to the matrix circuit. Each of the stacked structure array units is defined with a plurality of target regions arranged in an array. In each of the stacked structure array units, at least one of the micro semiconductor devices is correspondingly disposed in one of the target regions. Between two of the stacked structure array units, the target regions of an upper one of the stacked structure array units are aligned to the target regions of a lower one of the stacked structure array units, respectively, along the vertical direction. In at least one of the stacked structure array units, the matrix circuit of the conductive pattern layer is an active matrix circuit.

A micro semiconductor stacked structure comprises three stacked structure array units, wherein two of the stacked structure array units are stacked on the bottommost stacked structure array unit. The two stacked structure array units are stacked on the bottommost stacked structure array unit along a vertical direction. Each of the stacked structure array units comprises a substrate, a conductive pattern layer disposed on the substrate, and a plurality of micro LED chips disposed on the substrate and arranged in an array. Each of the conductive pattern layers comprises a matrix circuit, and the micro semiconductor devices are electrically connected to the matrix circuit. Each of the stacked structure array units is defined with a plurality of pixels arranged in an array. In each of the stacked structure array units, at least one of the micro LED chips is correspondingly disposed in one of the pixels. Between two of the stacked structure array units, the pixels of an upper one of the stacked structure array units are aligned to the pixels of a lower one of the stacked structure array units, respectively, along the vertical direction. In at least one of the three stacked structure array units, the matrix circuit of the conductive pattern layer is an active matrix circuit.

In some embodiments, the micro semiconductor stacked structure further comprises at least one stair portion. The at least one stair portion is formed based on sizes of the substrates decreasing sequentially along a direction toward the upper stacked structure array unit or away from the lower stacked structure array unit.

In some embodiments, in two of the stacked structure array units, the conductive pattern layers of the upper stacked structure array unit are connected to the conductive pattern layers of the lower stacked structure array unit by at least one electronic connecting member.

In some embodiments, the at least one stair portion comprises an electronic connecting member, and in two of the stacked structure array units, the conductive pattern layers of the upper stacked structure array unit are connected to the conductive pattern layers of the lower stacked structure array unit by the electronic connecting member.

In some embodiments, a size of each of the micro semiconductor devices is 1-50 μm.

In some embodiments, a size of each of the micro LED chips is 1-50 μm.

In some embodiments, the substrates of the stacked structure array units are transparent; or the substrate of the bottommost stacked structure array unit is nontransparent.

In some embodiments, the substrates of the stacked structure array units are rigid substrates or flexible substrates.

In some embodiments, the two of the stacked structure array units are bonded by an adhesive material.

In some embodiments, the adhesive material performs a planarization of the lower stacked structure.

In some embodiments, the substrates of the stacked structure array units are dielectric layers formed by a semiconductor coating process.

In some embodiments, the conductive pattern layer of the bottommost stacked structure array unit is an active circuit configured with a TFT switch or a MOS switch.

In some embodiments, the micro semiconductor device of each of the stacked structure array units is a micro LED chip, a micrometer photo detector chip, or a combination thereof.

In some embodiments, the three stacked structure array units are configured with a red micro LED chip, a green micro LED chip and a blue micro LED chip, respectively, along the direction toward the upper stacked structure array unit or away from the lower stacked structure array unit, and the light output sides of the micro LED chips are disposed close to the upper stacked structure array unit or away from the lower stacked structure array unit.

In some embodiments, an electronic apparatus comprises a plurality of micro semiconductor stacked structures arranged in an array, and an external electronic control structure electrically connected to the conductive pattern layer of at least one of the stacked structures.

In some embodiments, an electronic apparatus comprises micro semiconductor stacked structures and an external electronic control structure electrically connected to the conductive pattern layer of at least one of the stacked structures.

In some embodiments, an electronic apparatus comprises micro semiconductor stacked structures and at least one external electronic control structure electrically connected to the conductive pattern layer of at least one of the stacked structure array units.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

This disclosure provides a micro semiconductor stacked structure, which comprises at least two stacked structures, wherein one of the stacked structures is stacked on the other one of the stacked structures. The one of the stacked structures is stacked on the other one of the stacked structures along a vertical direction. Each of the stacked structures comprises a substrate, a conductive pattern layer disposed on the substrate, and one or more micro semiconductor devices disposed on the substrate and electrically connected to the conductive pattern layer. Each of the stacked structures defines a target region, and at least one micro semiconductor device of each stacked structure is disposed in the target region. Between two of the stacked structures, the target regions are aligned along the vertical direction, and in at least one of the stacked structures, the conductive pattern layer is an active circuit. The above-mentioned micro semiconductor stacked structure will be further described in the following embodiments.

First Embodiment

Figure 2:
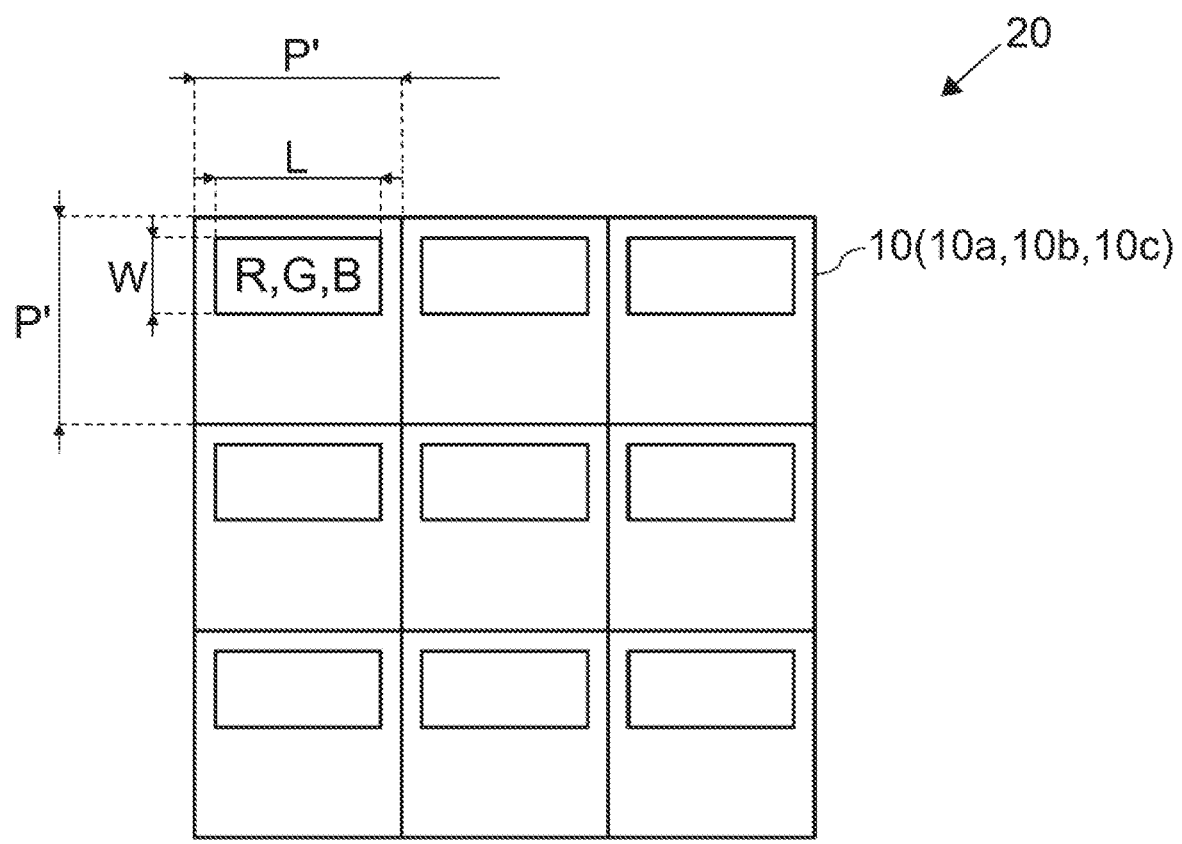
FIG. 2 is a top view of an electronic apparatus comprising a plurality of micro semiconductor stacked structure arrays according to a first embodiment of this disclosure.
Figure 3A:
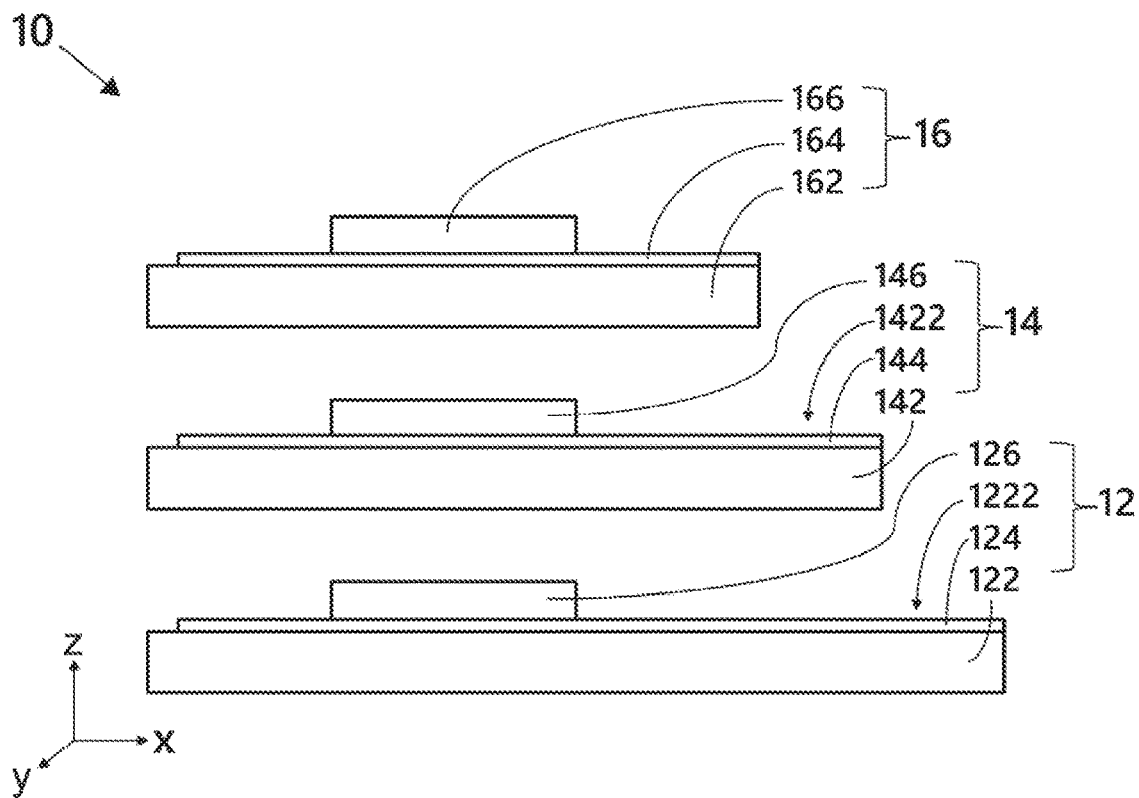
FIG. 3A is a schematic diagram showing a manufacturing procedure of the micro semiconductor stacked structure according to the first embodiment of this disclosure.
Figure 3B:
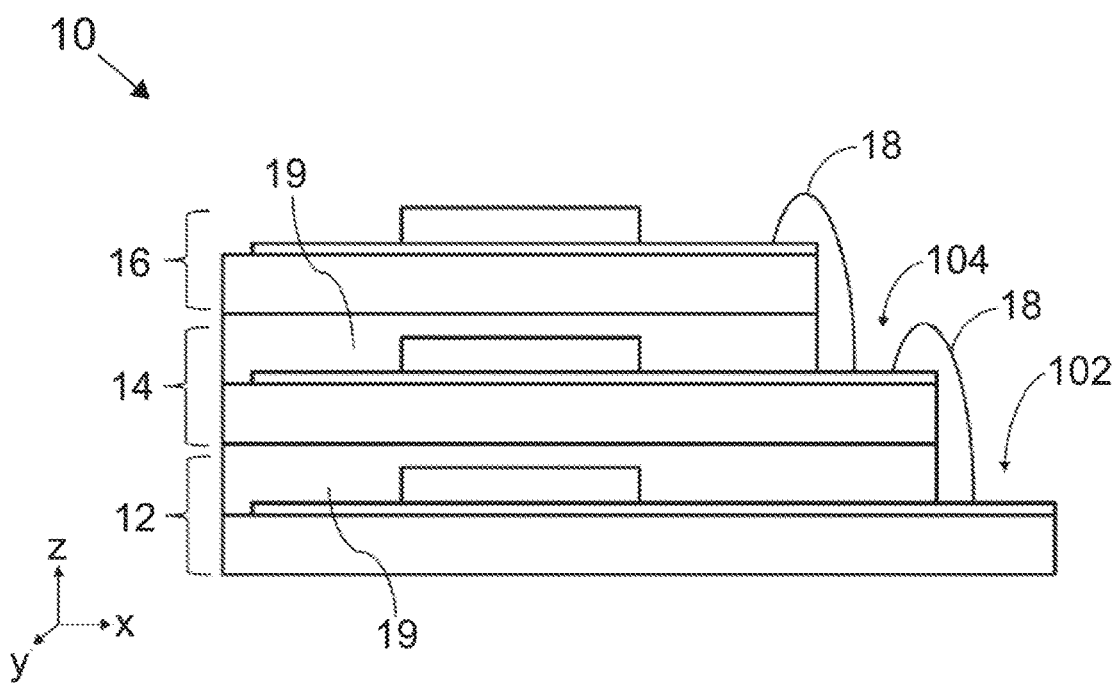
FIG. 3B is a schematic diagram showing the structure of the micro semiconductor stacked structure according to the first embodiment of this disclosure.

This disclosure provides a micro semiconductor stacked structure comprising three stacked structures, wherein two stacked structures are stacked on the bottommost stacked structure. The two stacked structures are stacked on the bottommost stacked structure along a vertical direction. Each of the stacked structures comprises a substrate, a conductive pattern layer disposed on the substrate, and at least one micro LED chip disposed on the substrate and electrically connected to the conductive pattern layer. Each of the stacked structures defines a pixel, and the micro LED chip of each stacked structure is disposed in the pixel. Between two of the stacked structures, the target regions are aligned along the vertical direction, and in at least one of the three stacked structures, the conductive pattern layer is an active circuit. Referring to FIGS. 2, 3A and 3B, the micro semiconductor stacked structure 10 and the electronic apparatus 20 comprising the same according to the first embodiment of this disclosure will be described hereinafter. In this embodiment, the electronic apparatus 20 is a color display unit.

As shown in FIG. 3B, the micro semiconductor stacked structure 10 comprises a first stacked structure 12, a second stacked structure 14 and a third stacked structure 16. A vertical direction Z is defined based on one of the three stacked structures, and the other two stacked structures are stacked on the previous stacked structure in order along the vertical direction Z. In the micro semiconductor stacked structure 10 of this embodiment, the first stacked structure 12 is defined with a first direction X, a second direction Y and a vertical direction Z. Wherein, the first direction X and the second direction Y define a plane, and the vertical direction Z is perpendicular to the defined plane. The second stacked structure 14 and the third stacked structure 16 are stacked on the first stacked structure 12 along the defined vertical direction Z of the first stacked structure 12. The third stacked structure 16 is disposed on the second stacked structure 14.

In this embodiment, the first stacked structure 12 comprises a first substrate 122, a first conductive pattern layer 124 disposed on the first substrate 122, and a first micro semiconductor device 126 disposed on the first substrate 122 and electrically connected to the first conductive pattern layer 124. The second stacked structure 14 comprises a second substrate 142, a second conductive pattern layer 144 disposed on the second substrate 142, and a second micro semiconductor device 146 disposed on the second substrate 142 and electrically connected to the second conductive pattern layer 144. The third stacked structure 16 comprises a third substrate 162, a third conductive pattern layer 164 disposed on the third substrate 162, and a third micro semiconductor device 166 disposed on the third substrate 162 and electrically connected to the third conductive pattern layer 164. In the micro semiconductor stacked structure 10 of this embodiment, the first substrate 122, the second substrate 142 and the third substrate 162 are rigid transparent substrates such as glass, quartz, sapphire or the likes, and the thickness of the rigid transparent substrates ranges from 10 to 500 μm. At least one of the first conductive pattern layer 124, the second conductive pattern layer 144 and the third conductive pattern layer 164 is an active circuit comprising a TFT or MOS switch. In the micro semiconductor stacked structure 10 of this embodiment, the first conductive pattern layer 124 is an active circuit comprising a TFT or MOS switch. The first micro semiconductor device 126, the second micro semiconductor device 146 and the third micro semiconductor device 166 are micro LED chips, which can emit lights of different wavelengths. For example, the micro LED chips can be red, green and blue micro LED chips, and the sizes of the micro LED chips is 1-50 μm. The micro LED chips can be, for example but not limited to, vertical-type or flip-chip micro LED chips. The light output sides of the micro LED chips are close to the upper stacked structure or away from the lower stacked structure.

Each stacked structure 12, 14 or 16 defines a pixel, and the micro semiconductor devices 126, 146 and 166 of the stacked structures 12, 14 and 16 are disposed in the corresponding pixels. In other words, the micro LED chips are disposed in the corresponding target regions. Between two of the stacked structures 12, 14 and 16, the pixels are aligned along the vertical direction Z. In other words, the target regions are aligned to each other.

In this embodiment, the sizes of the first substrate 122, the second substrate 142 and the third substrate 162 are decreased sequentially. Accordingly, the first substrate 122 is defined with a first stair region 1222, and the second substrate 142 is defined with a second stair region 1422. After stacking the first stacked structure 12, the second stacked structure 14 and the third stacked structure 16, the first stair region 1222 and the second stair region 1422 can be exposed so as to form the first stair portion 102 and the second stair portion 104 of the micro semiconductor stacked structure 10 as shown in FIG. 3B. In this embodiment, the first conductive pattern layer 124 extends to the first stair region 1222 of the first substrate 122, and the second conductive pattern layer 144 extends to the second stair region 1422 of the second substrate 142. Accordingly to the configuration of the first stair portion 102 and the second stair portion 104, the electronic connecting member can be formed to electrically connect two stacked structures by wire bonding, solder bump, or filling conductive material in a through hole. In this embodiment, the electronic connecting member 18 is formed by wire bonding. Whether the first conductive pattern layer 144 and the second conductive pattern layer 164 extend to the first stair region 1222 and the second stair region 1422 is not the key point of this disclosure, and any configuration that allows the electronic connecting member 18 to electrically connect the conductive pattern layers of any two stacked structures is applicable. In addition, whether the electronic connecting member 18 is formed by wire bonding, solder bump, or filling conductive material in a through hole is not the key point of this disclosure, and any configuration that allows the electronic connecting member 18 to electrically connect the conductive pattern layers 124, 144 and 164 is applicable.

As shown in FIG. 3B, in the first stacked structure 12, the second stacked structure 14 and the third stacked structure 16 of the micro semiconductor stacked structure 10, two stacked structures can be connected. In this embodiment, two stacked structures can be bonded by an adhesive material 19. In this disclosure, the adhesive material 19 can be, for example but not limited to, a solid material or a liquid material, and any material that can be applied between two stacked structures for bonding is applicable. In this embodiment, the adhesive material 19 can perform the planarization of the lower stacked structure, but this disclosure is not limited thereto.

Specifically, the manufacturing procedure of the micro semiconductor stacked structure 10 of this disclosure will be described hereinafter with reference to FIG. 3A. Firstly, the first micro semiconductor device 126, the second micro semiconductor device 146 and the third micro semiconductor device 166 are disposed on the first substrate 122, the second substrate 142 and the third substrate 162, respectively, so as to form the first stacked structure 12, the second stacked structure 14 and the third stacked structure 16. The first substrate 122, the second substrate 142 and the third substrate 162 are rigid transparent substrates and are configured with the first conductive pattern layer 124, the second conductive pattern layer 144 and the third conductive pattern layer 164, respectively, in advance. The sizes of each of the substrates 122, 142 and 162 are based on the actual application. In other words, without limiting by the array transferring method, the micro LED chips of the same color are arranged in an array (e.g. an array of red micro LED chips), and the color micro LED array is transferred to the target substrate (large substrate) (not shown). Then, the large substrate is cut along the color micro LED chip (e.g. the red micro LED chip), thereby forming the individual micro LED chip disposed on the corresponding substrate 122, 142 or 162. For example, the red micro LED chip 126 is disposed on the first substrate 122. To be noted, each of the substrates 122, 142 and 162 only carries a monochrome micro LED chip, and the relation between the materials of the substrates 122, 142 and 162 and the wavelengths of the emitted lights of the carried micro LED chips is not limited.

Afterwards, each micro LED chip can be tested through the conductive pattern layer 122, 144 or 164 on the corresponding substrate 122, 142 or 162, thereby screening the micro LED chips of different colors based on the requirements (e.g. color, wavelength, brightness). To be noted, before the above step, the failure products of the micro semiconductor stacked structures 10 can be selected out in advance. The conventional method of detecting out the failure products after assembling three sub-pixels 110$a$, 120$a$ and 130$a$ to form a pixel 100$a$ is not applied in this embodiment. Then, one of the classified first stacked structures 12, one of the classified second stacked structures 14, and one of the classified third stacked structures 16 are selected and stacked so as to form the micro semiconductor stacked structure 10 of this embodiment. In addition, two of the stacked structures 12, 14 and 16 are selected based on the materials thereof so as to bond the stacked structures 12, 14 and 16. Alternatively, the adhesive material 19 is provided to bond the stacked structure 12, 14 and 16 and further performs the planarization of the lower stacked structure.

In the step of cutting the target substrate (large substrate) to obtain the substrates 122, 142 and 162, the sizes of the substrates 122, 142 and 162 can be cut based on the color requirements and are decreased sequentially. In this embodiment, the size of the first substrate 122 configured with the red micro LED chip is greater than the size of the second substrate 142 configured with the green micro LED chip, and the size of the second substrate 142 configured with the green micro LED chip is greater than the size of the third substrate 162 configured with the blue micro LED chip. Accordingly, the first stair portion 102 and the second stair portion 104 can be formed. After forming the first stair portion 102 and the second stair portion 104, the electronic connecting member 18 is formed on the first stair portion 102 and the second stair portion 104 by wire bonding, solder bump or filling through holes, thereby providing the signal connection between the stacked structure configured with the TFT or MOS switch and the other stacked structure(s). For example, the signal connection between the first stacked structure 12 and the second stacked structure 14, the signal connection between the second stacked structure 14 and the third stacked structure 1, or the signal connection between the first stacked structure 12 and the third stacked structure 16.

In addition, before the step of cutting the target substrate (large substrate) to obtain the substrates 122, 142 and 162, a plurality of conductive pattern layers 124, 144 and 164 are formed on the target substrate (large substrate) in advance. After the step of cutting the target substrate (large substrate), each of the obtained substrates is configured with a conductive pattern layer. For example, each first substrate 122 is configured with a first conductive pattern layer 124. The conductive pattern layer can be, for example but not limited to, an active circuit or a passive circuit, and at least one of the conductive pattern layers is an active circuit. To be noted, in this embodiment, the first conductive pattern layer 124 is an active circuit configured with a TFT or MOS switch.

The electronic connecting member is further connected to the external electronic control structure (not shown), thereby achieving the electronic apparatus 20 (color display unit) of this embodiment. In the conventional micro LED display technology of FIG. 1, the pixel area P*P of the conventional micro LED display technology is slightly greater than 3W*3W, and there are four pixels formed within the limited area of FIG. 1. Compared with the conventional micro LED display technology of FIG. 1, the micro semiconductor stacked structure 10 of this embodiment is formed by three stacked structures (the first, second and third stacked structures 12, 14 and 16), which comprise three color (R, G, B) micro LED chips. Taking three micro LED devices with the same size as an example, the pixel width P' of this embodiment is slightly greater than L, and the pixel area P'*P' is slightly greater than L*L. Obviously, the pixel area P'*P' of this embodiment is smaller than the pixel area P*P of the conventional micro LED display technology, which is slightly greater than 3W*3W. As a result, this disclosure can decrease the pixel area. In this embodiment, the electronic apparatus 20 is composed of a plurality of micro semiconductor stacked structures 10 arranged in an array so as to form a color display unit. As shown in FIG. 2, under the condition of approaching the limited area of FIG. 1, the unit area of each micro semiconductor stacked structure 10 of this disclosure is decreased, thereby increasing the pixel density in the electronic apparatus 20. Specifically, in the conventional micro LED display technology of FIG. 1, four pixels are configured in the limited area, but nine pixels are configured in the limited area in the electronic apparatus 20 of FIG. 2. Obviously, this disclosure has higher resolution.

To be noted, this embodiment can further provide a redundancy mechanism based on the application requirement, which is to configure an additional micro LED chip for each color within a single pixel. For example, a single pixel may comprise two red micro LED chips, two green micro LED chips, and two blue micro LED chips. In each stacked structure, the two micro LED chips of the same color corresponding to the same pixel are both driven by the above-mentioned conductive pattern layer. Since the risk that the two micro LED chips both fail is extremely low, the manufacturing yield of this disclosure can be improved. In addition, this redundancy mechanism can be applied to other embodiments of this disclosure.

To be noted, along the direction toward the upper stacked structure or away from the lower stacked structure, the micro semiconductor devices 126, 146 and 166 of the first stacked structure 12, the second stacked structure 14 and the third stacked structure 16 are red (R), green (G) and blue (B) micro LED chips, respectively, and the light output sides of the micro LED chips are all close to the upper stacked structure or away from the lower stacked structure.

Figure 1:
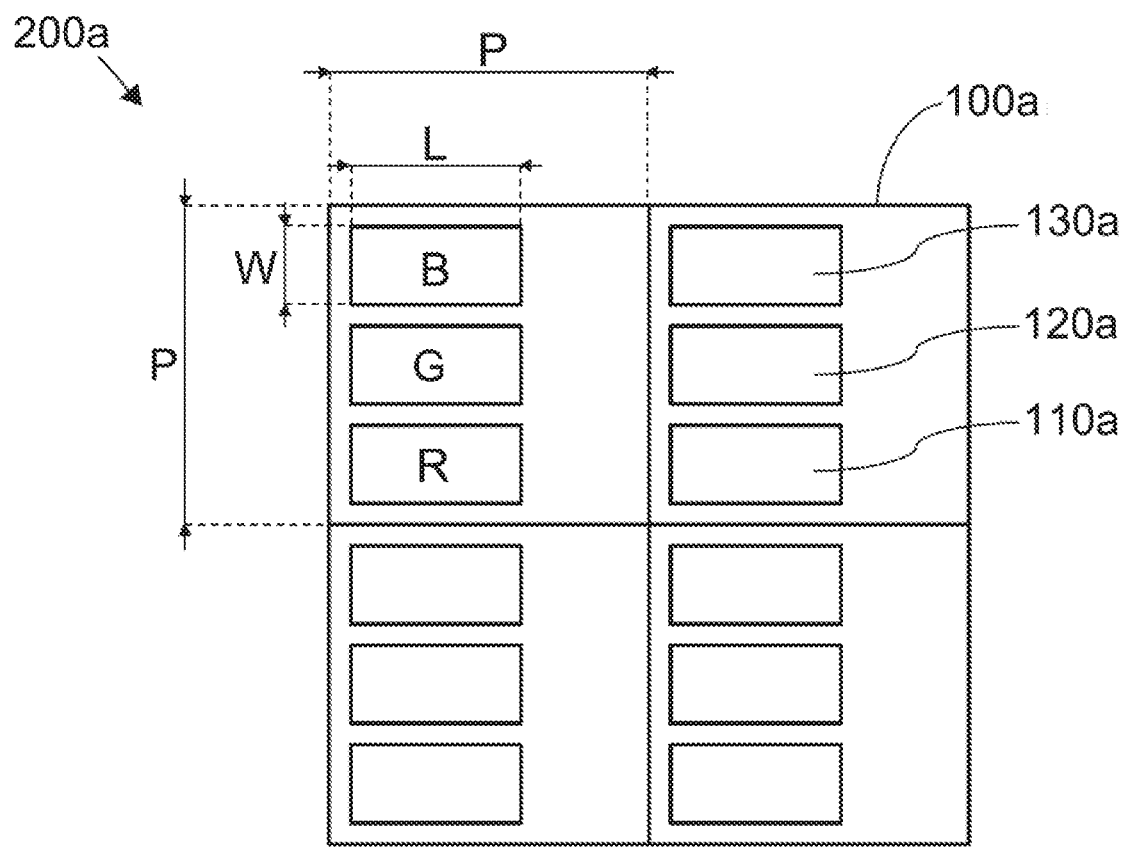
FIG. 1 is a top view of a conventional electronic apparatus.

As shown in FIG. 2, the electronic apparatus 20 of this embodiment is a color display unit, which has a higher resolution with the same limited area as the convention micro LED display technology of FIG. 1. In this embodiment, the electronic apparatus 20 can be a color display module to be combined with other units for displaying, an individual color display apparatus, or the likes, and this disclosure is not limited. Any electronic apparatus 20 that is composed of an array of the micro semiconductor stacked structures 10 is within the scope of this disclosure.

Second Embodiment

Figure 4A:
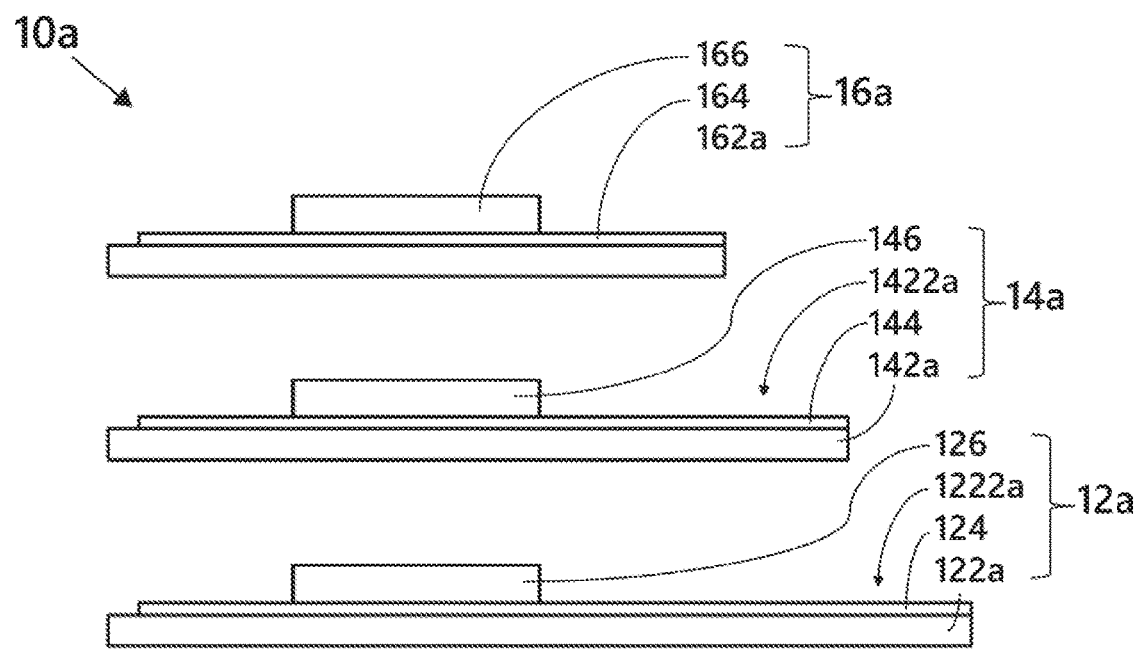
FIG. 4A is a schematic diagram showing a manufacturing procedure of the micro semiconductor stacked structure according to the second embodiment of this disclosure.
Figure 4B:
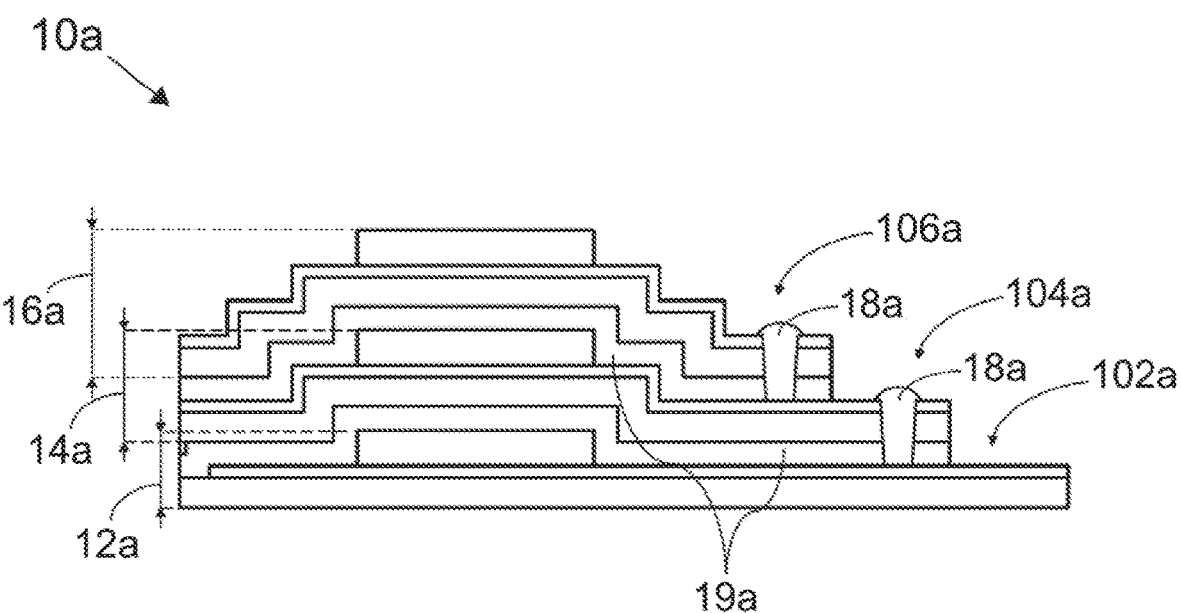
FIG. 4B is a schematic diagram showing the structure of the micro semiconductor stacked structure according to the second embodiment of this disclosure.

Referring to FIGS. 2, 4A and 4B, the micro semiconductor stacked structure 10a and the electronic apparatus 20a comprising an array of a plurality of micro semiconductor stacked structures 10a according to the second embodiment of this disclosure will be described hereinafter. In this embodiment, the micro semiconductor stacked structure 10a and the electronic apparatus 20a are similar to the micro semiconductor stacked structure 10 and the color display unit of the first embodiment, and only the difference between the first and second embodiments will be described hereinafter. As shown in FIG. 4A, the micro semiconductor stacked structure 10a comprises a first stacked structure 12a, a second stacked structure 14a and a third stacked structure 16a. The first substrate 122a of the first stacked structure 12a, the second substrate 142a of the second stacked structure 14a, and the third substrate 162a of the third stacked structure 16a are flexible transparent substrates, which are made of polyimide, PEN, PET, or the likes. The thickness of the flexible transparent substrate ranges from 5 to 100 μm.

According to FIG. 4A, one of the classified first stacked structures 12a, one of the classified second stacked structures 14a, and one of the classified third stacked structures 16a are selected and stacked so as to form the micro semiconductor stacked structure 10a as shown in FIG. 4B. In this embodiment, the sizes of the substrates 122a, 142a and 162a can be decreased sequentially, so that the first substrate 122a defines a first stair region 1222a, and the second substrate 142a defines a second stair region 1422a. Since the substrates 122a, 142a and 162a are all flexible transparent substrates, after stacking the first stacked structure 12a, the second stacked structure 14a and the third stacked structure 16a, the first stair region 1222a and the second stair region 1422a are exposed so as to form the first stair portion 102a and the second stair portion 104a of the micro semiconductor stacked structure 10a of FIG. 4B. In addition, the third stacked structure 16a can further form at least one third stair portion 106a along the surface profile of the second stacked structure 14a.

Two stacked structures can be bonded by an adhesive material 19a. In this embodiment, the adhesive material 19a can perform the planarization of the lower stacked structure, so that the upper and the lower stacked structures can be bonded smoothly. The planarization effect can be referred to the embodiment of FIG. 3B. Alternatively, the adhesive material 19a may not provide the planarization function, so that the upper stacked structure is bonded to the original surface profile of the lower stacked structure.

In addition, the electronic connecting member 18a of this embodiment is formed by filling a through hole with conductive material for electrically connecting the conductive pattern layers of two stacked structures.

Third Embodiment

Figure 5:
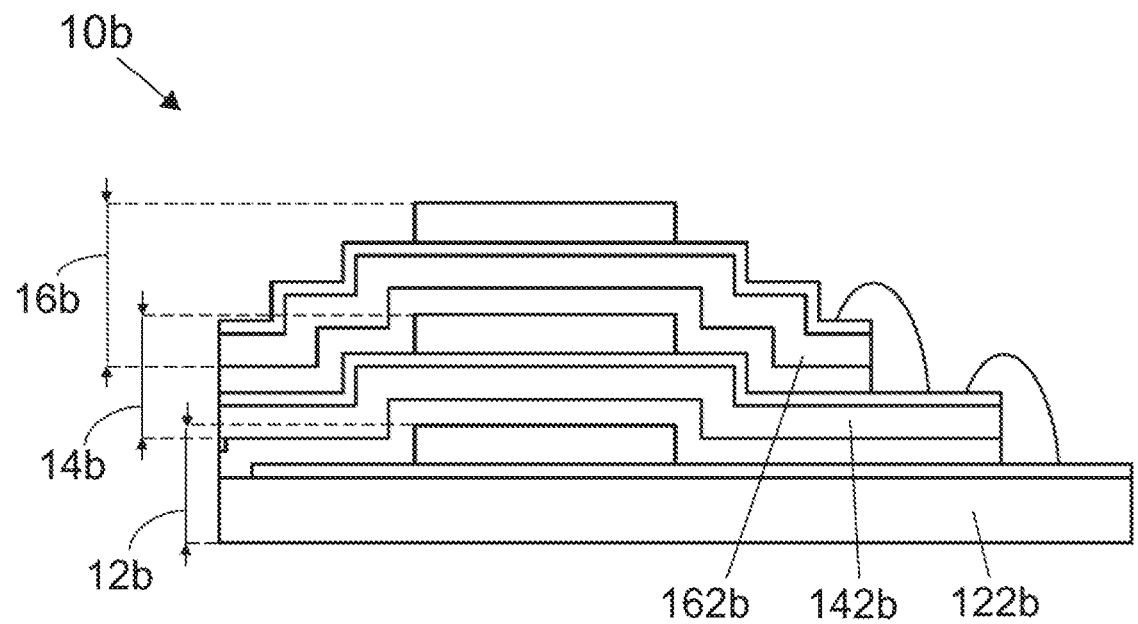
FIG. 5 is a schematic diagram showing the structure of the micro semiconductor stacked structure according to a third embodiment of this disclosure.

Referring to FIGS. 2 and 5, the micro semiconductor stacked structure 10b and the electronic apparatus 20b having the same according to the third embodiment of this disclosure will be described hereinafter. In this embodiment, the micro semiconductor stacked structure 10b refers to the combination of the materials, manufacturing processes and structures of the micro semiconductor stacked structure 10 of the first embodiment and the micro semiconductor stacked structure 10a of the second embodiment. Only the features of the third embodiment different from the first and second embodiments will be described hereinafter. As shown in FIG. 5, the micro semiconductor stacked structure 10b comprises a first stacked structure 12b, a second stacked structure 14b and a third stacked structure 16b. The first stacked structure 12b adopts the first substrate 122 of the micro semiconductor stacked structure 10 of the first embodiment, and the second stacked structure 14b and the third stacked structure 16b adopt the second substrate 142a and the third substrate 162a of the micro semiconductor stacked structure 10a of the second embodiment, respectively. The first substrate 122b is a rigid transparent substrate such as glass, quartz, sapphire or the likes, and the thickness of the rigid transparent substrate ranges from 10 to 500 μm. The second substrate 142b and the third substrate 162b are flexible transparent substrates, which are made of polyimide, PEN, PET, or the likes. The thickness of the flexible transparent substrates ranges from 5 to 100 μm. In this embodiment, the electronic connecting member is formed by wire bonding for electrically connecting the conductive pattern layers of two stacked structures.

In addition, the first substrate 122b can be a nontransparent substrate such as the silicon wafer. The other substrates including the second substrate 142b and the third substrate 162b are made of transparent material that allows the visible light to pass through. Each stacked structure can be a rigid or flexible transparent substrate, and this disclosure is not limited thereto. For example, two of the stacked structures are rigid transparent substrates, and the residual stacked structure is a flexible transparent substrate. Alternatively, the first substrate 122b is a rigid nontransparent substrate, and the other two stacked structures are rigid transparent substrates. In another case, the substrate of at least one of the stacked structures is a transparent substrate comprising both of a rigid part and a flexible part. In this embodiment, the substrates of the stacked structures can be in any status based on the actual requirement, the point is that the configuration of the substrates does not block the light emitted from the LEDs.

Fourth Embodiment

Figure 6:
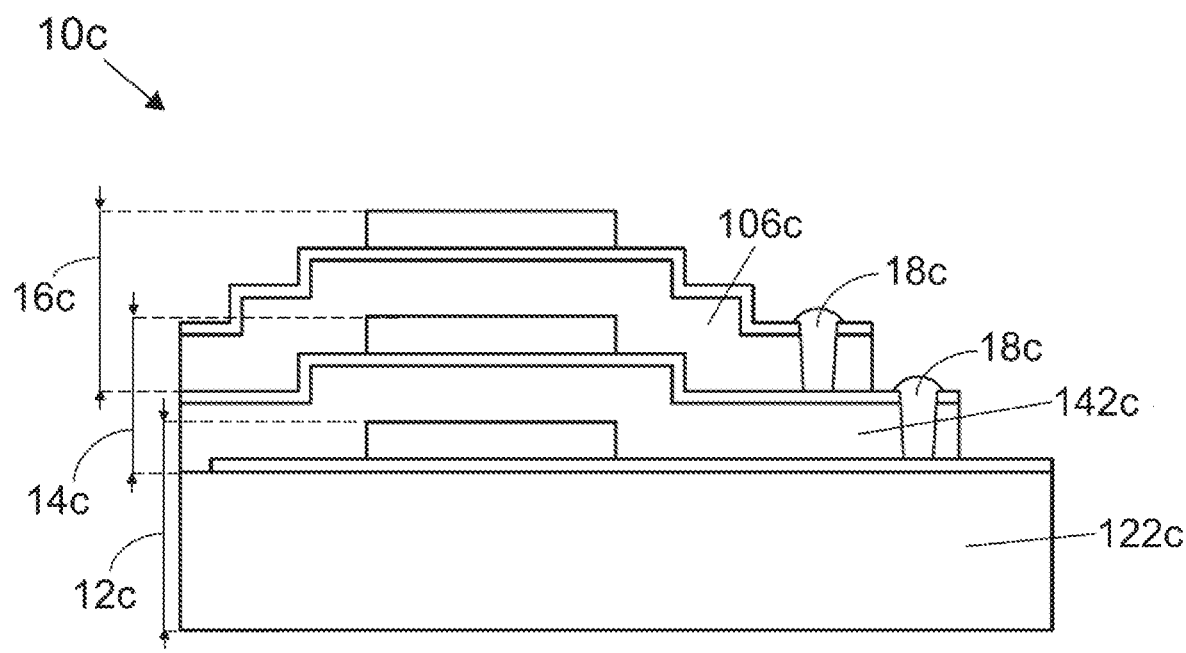
FIG. 6 is a schematic diagram showing the structure of the micro semiconductor stacked structure according to the fourth embodiment of this disclosure.

Referring to FIGS. 2 and 6, the micro semiconductor stacked structure 10c and the electronic apparatus 20c having the same according to the fourth embodiment of this disclosure will be described hereinafter. As shown in FIG. 6, the micro semiconductor stacked structure 10c comprises a first stacked structure 12c, a second stacked structure 14c and a third stacked structure 16c. In this embodiment, a vertical direction Z is defined based on the first stacked structure 12c, and the second stacked structure 14c and the third stacked structure 16c are stacked on the first stacked structure 12c in order.

The first stacked structure 12c comprises a first substrate 122c, a first conductive pattern layer 124c disposed on the first substrate 122c, and a first micro semiconductor device 126c disposed on the first substrate 122c and electrically connected to the first conductive pattern layer 124c. The first substrate 122c is a transparent rigid substrate (e.g. glass, quartz or sapphire) or a nontransparent rigid substrate (e.g. silicon wafer). The first conductive pattern layer 124c is an active circuit comprising a TFT or MOS switch. The first micro semiconductor device 126c, the second micro semiconductor device 146c and the third micro semiconductor device 166c are red, green and blue micro LED chips, respectively. The second stacked structure 14c comprises a second substrate 142c, a second conductive pattern layer 144c disposed on the second substrate 142c, and a second micro semiconductor device 146c disposed on the second substrate 142c and electrically connected to the second conductive pattern layer 144c. The third stacked structure 16c comprises a third substrate 162c, a third conductive pattern layer 164c disposed on the third substrate 162c, and a third micro semiconductor device 166c disposed on the third substrate 162c and electrically connected to the third conductive pattern layer 164c.

The manufacturing processes and the order of the manufacturing steps of the stacked structure of this embodiment is different from those of the previous embodiments. In the previous embodiments, multiple stacked structures are individually fabricated by forming the micro semiconductor device and the conductive pattern layer on the substrate, and then the individual stacked structures are selected and stacked to form the micro semiconductor stacked structure. In this embodiment, the steps for forming each stacked structure are individually performed so as to form the micro semiconductor stacked structure. This embodiment includes the following steps. After transferring the first micro semiconductor device 126c onto the first substrate 122c, a semiconductor coating process (e.g. a spin-on-glass process) is performed to form the second substrate 142c (as a dielectric layer) and the second conductive pattern layer 144c (as a metal circuit). Then, the second micro semiconductor device 146c is transferred onto the second substrate 142c, and the second micro semiconductor device 146c is electrically connected to the second conductive pattern layer 144c. Similarly, after transferring the second micro semiconductor device 146c onto the second substrate 142c, a semiconductor coating process is performed to form the third substrate 162c (as a dielectric layer) and the third conductive pattern layer 164c (as a metal circuit). Then, the third micro semiconductor device 166c is transferred onto the third substrate 162c, and the third micro semiconductor device 166c is electrically connected to the third conductive pattern layer 164c.

In this embodiment, during the semiconductor coating process, a semiconductor process is performed to fill the through hole for forming the electronic connecting member 18c. This step of filling the through hole can provide the signal connection between the stacked structure with the TFT or MOS switch and the other stacked structure(s) (e.g. between the first stacked structure 12c and the second stacked structure 14c, between the second stacked structure 14c and the third stacked structure 16c, or between the first stacked structure 12c and the third stacked structure 16c). To be noted, the step of filling the through hole to form the electronic connecting member can also be applied to other embodiments, and the electronic connecting member of this embodiment can also be formed by any of other suitable processes.

In this embodiment, the liquid polyimide is adopted to form the dielectric layers of the second substrate 142c and the third substrate 162c. This configuration can provide the functions of planarization of the lower stacked structure and bonding the two stacked structures.

Specifically, when the first conductive pattern layer 124c is an active circuit with a TFT or MOS switch, after transferring the first micro semiconductor device 126c onto the first substrate 122c, the consequent manufacturing procedure includes the following steps.

Fifth Embodiment

Figure 7:
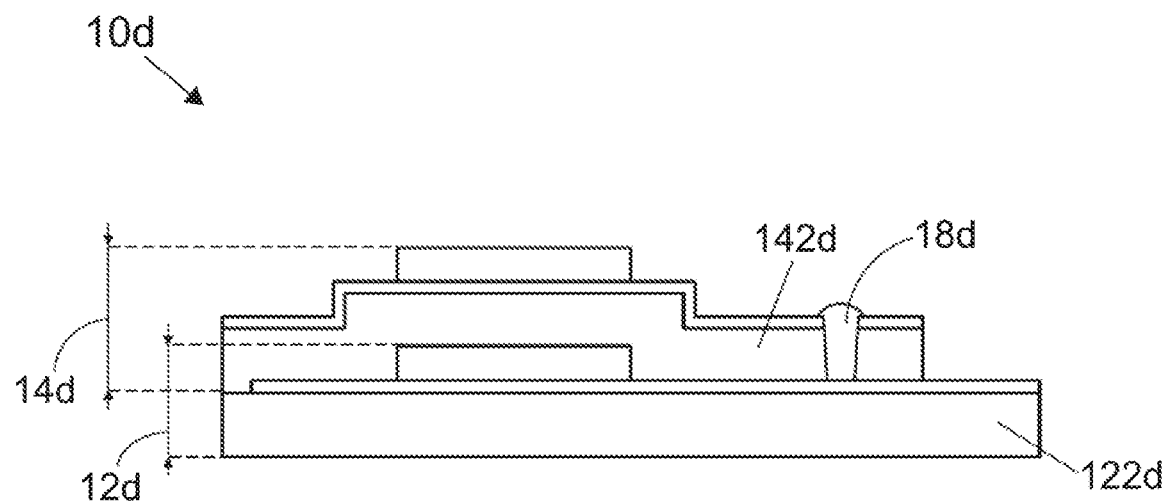
FIG. 7 is a schematic diagram showing the structure of the micro semiconductor stacked structure according to the fifth embodiment of this disclosure.

FIG. 7 discloses a micro semiconductor stacked structure 10d according to a fifth embodiment of this disclosure. Referring to FIG. 7, the micro semiconductor stacked structure 10d comprises a first stacked structure 12d and a second stacked structure 14d, which is stacked on the first stacked structure 12d along a vertical direction Z defined based on the first stacked structure 12d. The first stacked structure 12d comprises a first substrate 122d, a first conductive pattern layer 124d disposed on the first substrate 122d, and a first micro semiconductor device 126d disposed on the first substrate 122d and electrically connected to the first conductive pattern layer 124d. The second stacked structure 14d comprises a second substrate 142d, a second conductive pattern layer 144d disposed on the second substrate 142d, and a second micro semiconductor device 146d disposed on the second substrate 142d and electrically connected to the second conductive pattern layer 144d. The first substrate 122d is a transparent flexible substrate, or a transparent or nontransparent rigid substrate. The first conductive pattern layer 124d is an active circuit comprising a TFT or MOS switch. The second substrate 142d is a transparent flexible substrate or a transparent rigid substrate. The first micro semiconductor device 126d and the second micro semiconductor device 146d can be selected from the micrometer photo detector devices for detecting different wavelengths (e.g. an IR micro detector chip, or a UV micro detector chip). Accordingly, the electronic apparatus comprising the array of the micro semiconductor stacked structures 10d of this embodiment is a sensing apparatus.

The other structures, such as the electronic connecting member formed by wire bonding, solder bump or filling through holes, and the signal connection between the first stacked structure 12d and the second stacked structure 14d, can be referred to the third embodiment. In addition, since the electronic apparatus of this embodiment is a sensing apparatus, the IR micro sensing chip and UV sensing chip are also located in the target regions of the stacked structures 12d and 14d of the micro semiconductor stacked structure 10d, respectively, and the target regions are also aligned with each other.

Each stacked structure can be formed by any proper substrate without interfering the light sensing of the IR and UV micro sensing chips.

This embodiment indicates that the micro semiconductor stacked structure of this disclosure can be not only the light-emitting structure including micro LED chips (see first to fifth embodiments), but also the sensing structure including photo sensor chips (this embodiment), or the likes. For example, the micro semiconductor stacked structure can be a micro semiconductor stacked structure including micro LED chips and photo sensor chips (or pressure sensor chips or other sensor chips). The selection of the micro semiconductor devices is not limited to the above embodiments. The stacked structure comprising multiple substrates and multiple micro semiconductor devices disposed on the corresponding substrates and the structure formed by stacking multiple stacked structures are within the scope of the micro semiconductor stacked structure of this disclosure.

Sixth Embodiment

This disclosure also provides a micro semiconductor stacked structure comprising at least two stacked structure array units, wherein one of the stacked structure array units is stacked on the other one of the stacked structure array units. The one of the stacked structure array units is stacked on the other one of the stacked structure array units along a vertical direction. Each of the stacked structure array units comprises a substrate, a conductive pattern layer disposed on the substrate, and a plurality of micro semiconductor devices disposed on the substrate, arranged in an array, and electrically connected to the conductive pattern layer. Each of the conductive pattern layers comprises a matrix circuit, and the micro semiconductor devices are electrically connected to the matrix circuit. Each of the stacked structure array units is defined with a plurality of target regions arranged in an array. In each of the stacked structure array units, at least one of the micro semiconductor devices is correspondingly disposed in one of the target regions. Between two of the stacked structure array units, the target regions of an upper one of the stacked structure array units are aligned to the target regions of a lower one of the stacked structure array units, respectively, along the vertical direction. In at least one of the three stacked structure array units, the matrix circuit of the conductive pattern layer is an active matrix circuit.

The definitions of components of the micro semiconductor stacked structure of this embodiment are mostly the same as those of the previous embodiments. Different from the previous embodiments, the micro semiconductor devices of this embodiment are arranged in an array on a single substrate with a matrix circuit, and the units are stacked to form the micro semiconductor stacked structure. Specifically, one micro semiconductor stacked structure of the first to fifth embodiments comprises a single target region (e.g. one micro semiconductor stacked structure comprises a single pixel), but one micro semiconductor stacked structure of this embodiment comprises a plurality of target regions (e.g. one micro semiconductor stacked structure comprises multiple pixels). In the above first to fifth embodiments, one conductive pattern layer is formed on one substrate, and then a single micro semiconductor device is disposed on the substrate and electrically connected to the conductive pattern layer so as to form one stacked structure. Afterwards, the multiple stacked structures are stacked to form the desired micro semiconductor stacked structure. In the stacked structure array unit of this embodiment, a conductive pattern layer (comprising a matrix circuit) is formed on a substrate, and then a plurality of micro semiconductor devices are arranged in an array and electrically connected to matrix circuit of the conductive pattern layer so as to form one stacked structure array unit. Afterwards, the multiple stacked structure array units are stacked to form the micro semiconductor stacked structure of this embodiment.

The micro semiconductor stacked structure of this embodiment can be a color display unit as described hereinafter. A micro semiconductor stacked structure comprises three stacked structure array units, wherein two of the stacked structure array units are stacked on the bottommost stacked structure array unit. The two stacked structure array units are stacked on the bottommost stacked structure array unit along a vertical direction. Each of the stacked structure array units comprises a substrate, a conductive pattern layer disposed on the substrate, and a plurality of micro LED chips disposed on the substrate and arranged in an array. Each of the conductive pattern layers comprises a matrix circuit, and the micro semiconductor devices are electrically connected to the matrix circuit. Each of the stacked structure array units is defined with a plurality of pixels arranged in an array. In each of the stacked structure array units, at least one of the micro LED chips is correspondingly disposed in one of the pixels. Between two of the stacked structure array units, the pixels of an upper one of the stacked structure array units are aligned to the pixels of a lower one of the stacked structure array units, respectively, along the vertical direction. In at least one of the three stacked structure array units, the matrix circuit of the conductive pattern layer is an active matrix circuit.

Figure 8:
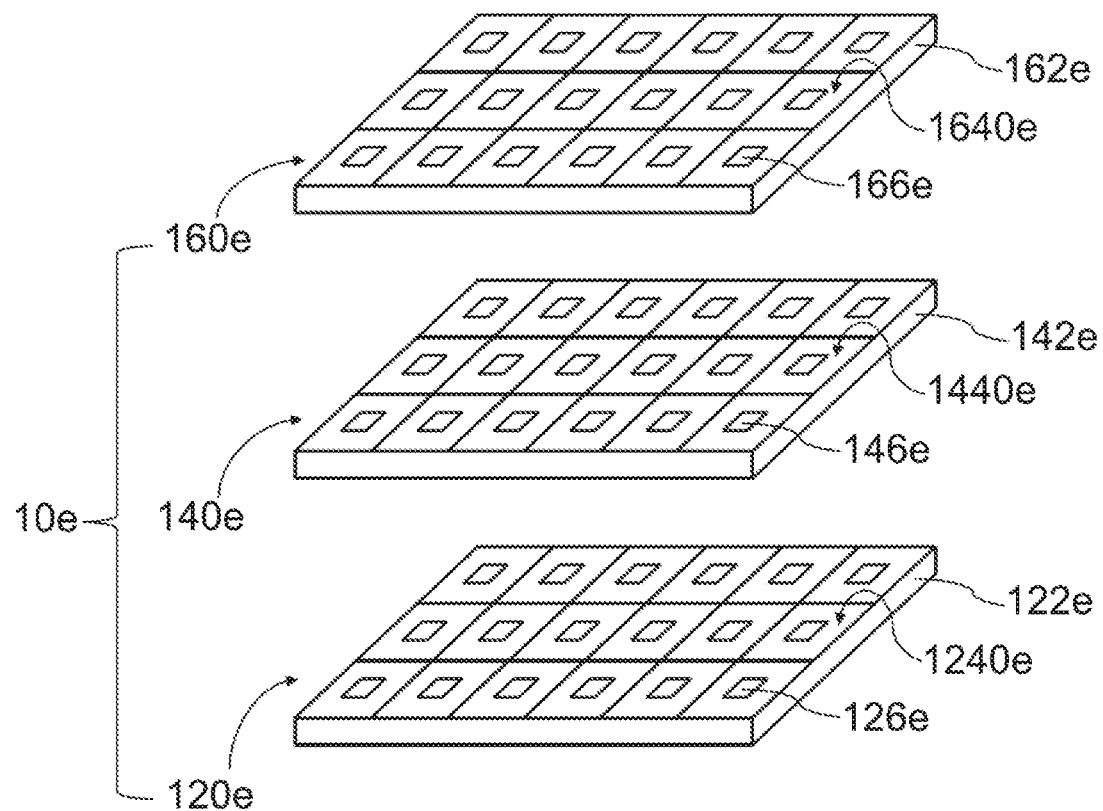
FIG. 8 is a schematic diagram showing the structure of the micro semiconductor stacked structure according to the sixth embodiment of this disclosure.
Figure 9:
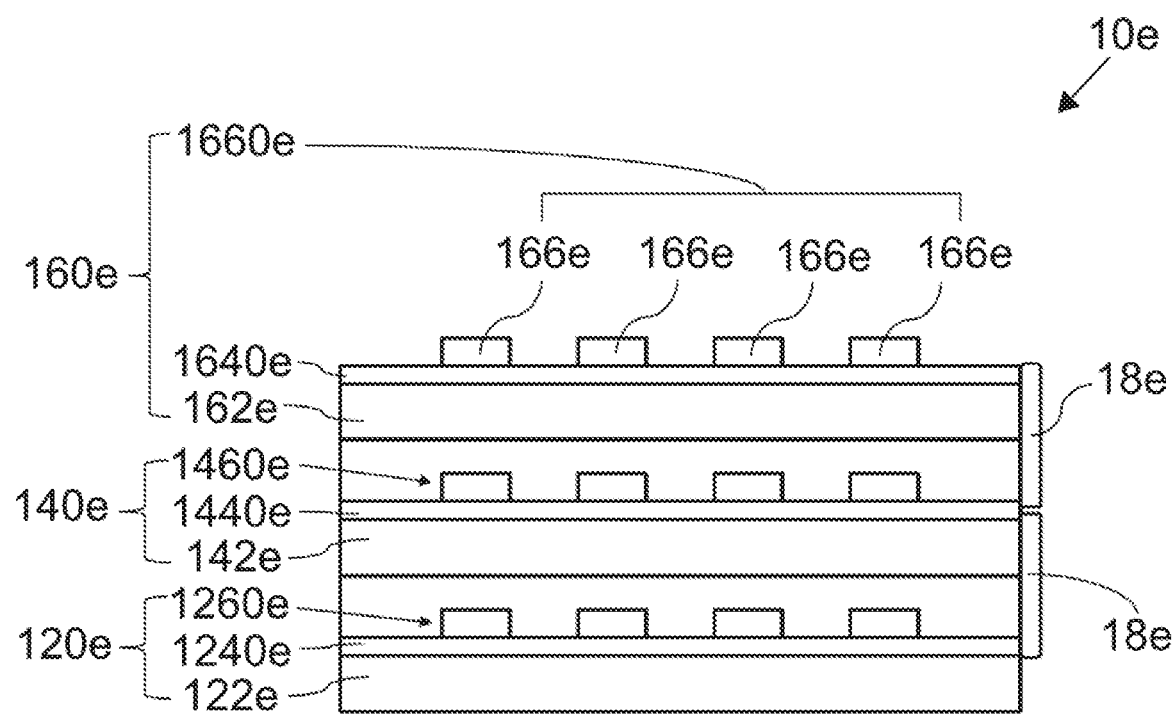
FIG. 9 is a schematic diagram showing the structure of the electronic apparatus according to the sixth embodiment of this disclosure.

FIG. 8 discloses a micro semiconductor stacked structure 10e according to a sixth embodiment of this disclosure. Referring to FIG. 8, the micro semiconductor stacked structure 10e comprises a first stacked structure array unit 120e, a second stacked structure array unit 140e and a third stacked structure array unit 160e, which are stacked in order. Each of the first, second and third stacked structure array units 120e, 140e or 160e comprises a substrate 122e, 142e or 162e, a conductive pattern layer 1240e, 1440e or 1640e disposed on the substrate 122e, 142e or 162e, and a plurality of micro semiconductor devices 126e, 146e or 166e disposed on the substrate 122e, 142e or 162e and electrically connected to the conductive pattern layer 1240e, 1440e or 1640e. Preferably, the plurality of micro semiconductor devices 126e, 146e or 166e are chip-level devices. In addition, in this embodiment, the sizes of the substrates 122e, 142e and 162e are sequentially decreased as mentioned in the above embodiments. As shown in FIG. 9, the stacked structure array units 120e, 140e and 160e are stacked, and the electronic connecting members 19e are formed by coating the conductive paste on the edges of the stacked structure array units 120e, 140e and 160e, thereby achieving the electrical connection between any two of the stacked structure array units. Furthermore, the electronic connecting members 19e is also configured to connect the external electronic control structure (not shown), thereby forming the electronic apparatus of this embodiment.

Specifically, the first stacked structure array unit 120e comprises a first substrate 122e, a conductive pattern layer 1240e disposed on the first substrate 122e, and a plurality of red micro LED chips (i.e. the micro semiconductor devices 126e) disposed in an array on the first substrate 122e and electrically connected to the conductive pattern layer 1240e. The reference number 1260e represents the red micro LED chip array 1260e. The conductive pattern layer 1240e is an active circuit comprising a TFT or MOS switch, and the red micro LED chips are electrically connected to the matrix circuit. Similarly, the second stacked structure array unit 140e comprises a second substrate 142e, a conductive pattern layer 1440e disposed on the second substrate 142e, and a plurality of green micro LED chips (i.e. the micro semiconductor devices 146e) disposed in an array on the second substrate 142e and electrically connected to the conductive pattern layer 1440e. The reference number 1460e represents the green micro LED chip array 1460e. The conductive pattern layer 1440e is a passive matrix circuit, and the green micro LED chips are electrically connected to the matrix circuit. The third stacked structure array unit 160e comprises a third substrate 162e, a conductive pattern layer 1640e disposed on the third substrate 162e, and a plurality of blue micro LED chips (i.e. the micro semiconductor devices 166e) disposed in an array on the third substrate 162e and electrically connected to the conductive pattern layer 1640e. The reference number 1660e represents the blue micro LED chip array 1660e. The conductive pattern layer 1640e is a passive matrix circuit, and the blue micro LED chips are electrically connected to the matrix circuit.

Each of the stacked structure array units 120e, 140e and 160e is defined with a plurality of pixels arranged in an array. In each of the stacked structure array units 120e, 140e and 160e, at least one of the micro LED chips (i.e. the micro semiconductor devices 126e, 146e and 166e) is correspondingly disposed in one of the pixels. Between two of the stacked structure array units, the pixels of an upper one of the stacked structure array units are aligned to the pixels of a lower one of the stacked structure array units, respectively, along the vertical direction.

In this embodiment, the electric property can be screened only after the step of disposing the micro semiconductor devices in an array on the substrate. Compared with the first embodiment, the cost for eliminating the failed products in this embodiment is higher than the cost for eliminating the failed products in first embodiment. However, since this embodiment can arrange the micro semiconductor devices in an array by one step, the total cost of this embodiment is lower than the total cost of the first embodiment. To be noted, the redundancy mechanism as described in the first embodiment can also be applied to this embodiment, so that a single pixel can be configured with an additional micro LED chip for each color. In each stacked structure, the two micro LED chips of the same color corresponding to the same pixel are both driven by the above-mentioned matrix circuit of the conductive pattern layer. Since the risk that the two micro LED chips both fail is extremely low, the cost for eliminating the failed products can be decreased and the manufacturing yield of this disclosure can be improved.

This embodiment indicates that the micro semiconductor stacked structure of this disclosure can be formed by disposing a plurality of micro semiconductor devices in an array on the substrate with a matrix circuit and then stacking the array-type stacked structure array units, thereby improving the manufacturing efficiency. In addition, this embodiment can further decrease the limited area of the micro semiconductor stacked structure and increase the density in the limited area of the electronic apparatus.

In addition, although the micro semiconductor devices of this embodiment are red, green and blue micro LED chips, the micro semiconductor devices and the numbers of the stacked structure array units are not limited to this embodiment.

Seventh to Eleventh Embodiments

The aspect of the sixth embodiment, which adopts the design of the stacked structure array units, can also be applied to the above-mentioned first to fifth embodiments.

Figure 10A:
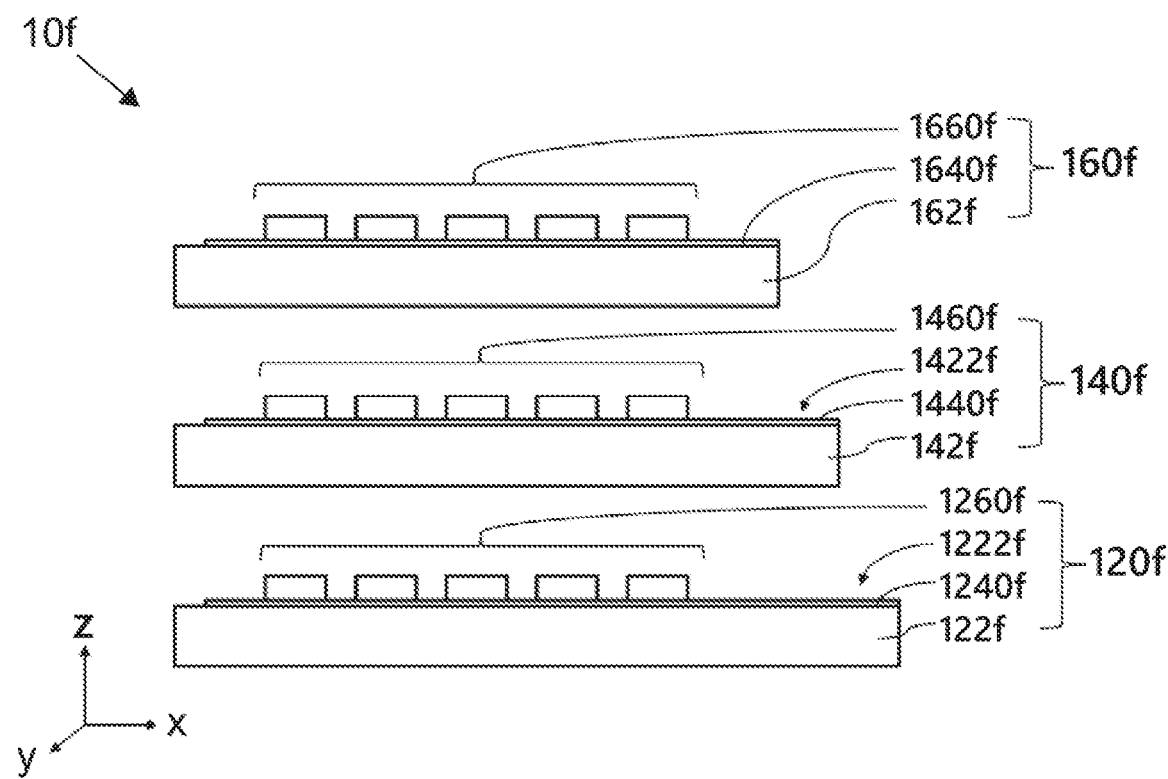
FIG. 10A is a schematic diagram showing a manufacturing procedure of the micro semiconductor stacked structure according to the seventh embodiment of this disclosure.
Figure 10B:
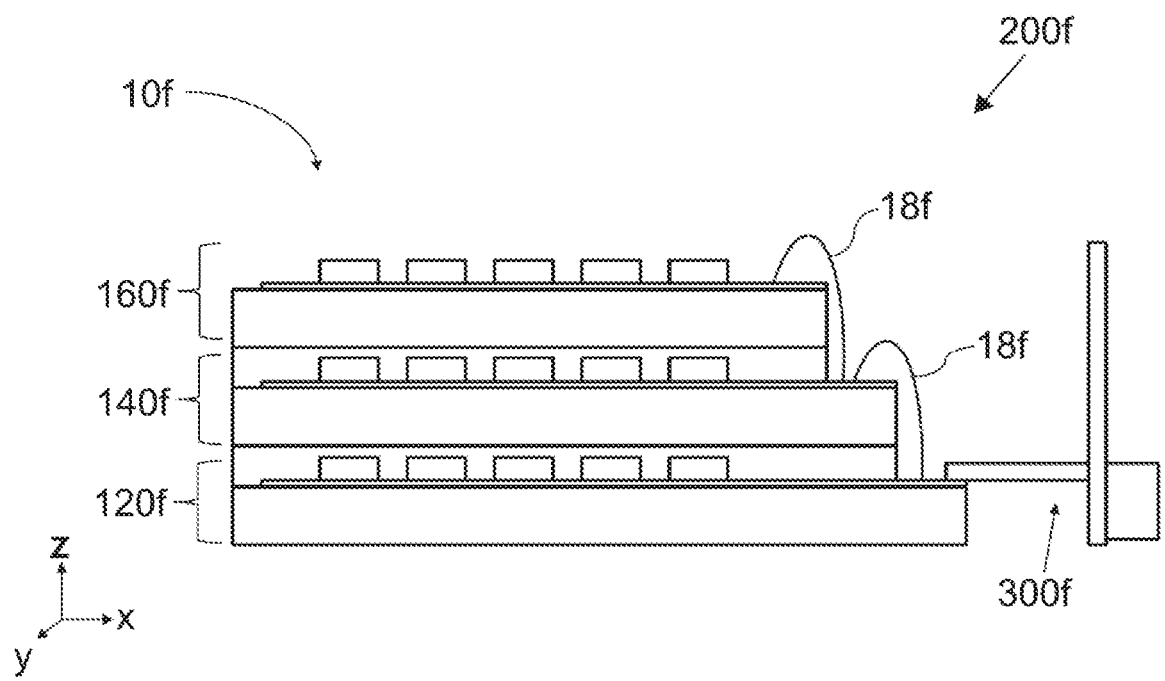
FIG. 10B is a schematic diagram showing the structure of an electronic apparatus comprising the micro semiconductor stacked structure according to the seventh embodiment of this disclosure.

As shown in FIGS. 10A and 10B, the micro semiconductor stacked structure 10f of the seventh embodiment adopts the design of the stacked structure array units applied in the first embodiment.

The seventh embodiment discloses an aspect adopting the design of stacked structure array units based on the first embodiment. The first stacked structure array unit 120f comprises a first substrate 122f, a conductive pattern layer 1240f disposed on the first substrate 122f, and a plurality of red micro LED chips (i.e. the micro semiconductor devices 1260 disposed in an array on the first substrate 122f and electrically connected to the conductive pattern layer 1240f The reference number 1260f represents the red micro LED chip array 1260f. The conductive pattern layer 1240f is an active circuit comprising a TFT or MOS switch, and the red micro LED chips (i.e. the micro semiconductor devices 1260 are electrically connected to the matrix circuit. Similarly, the second stacked structure array unit 140f comprises a second substrate 142f, a conductive pattern layer 1440f disposed on the second substrate 142f, and a plurality of green micro LED chips (i.e. the micro semiconductor devices 1460 disposed in an array on the second substrate 142*f* and electrically connected to the conductive pattern layer 1440*f*. The reference number 1460*f* represents the green micro LED chip array 1460*f*. The conductive pattern layer 1440*f* is a passive matrix circuit, and the green micro LED chips (i.e. the micro semiconductor devices 1460 are electrically connected to the matrix circuit. The third stacked structure array unit 160*f* comprises a third substrate 162*f*, a conductive pattern layer 1640*f* disposed on the third substrate 162*f*, and a plurality of blue micro LED chips (i.e. the micro semiconductor devices 1660 disposed in an array on the third substrate 162*f* and electrically connected to the conductive pattern layer 1640*f*. The reference number 1660*f* represents the blue micro LED chip array 1660*f*. The conductive pattern layer 1640*f* is a passive matrix circuit, and the blue micro LED chips (i.e. the micro semiconductor devices 1660 are electrically connected to the matrix circuit.

Different from the sixth embodiment, in this embodiment as shown in FIG. 10A, the sizes of the first substrate 122*f*, the second substrate 142*f* and the third substrate 162*f* are decreased sequentially. Accordingly, the first substrate 122*f* is defined with a first stair region 1222*f*, and the second substrate 142*f* is defined with a second stair region 1422*f*. After stacking the first stacked structure array unit 120*f*, the second stacked structure array unit 140*f* and the third stacked structure array unit 160*f*, the first stair region 1222*f* and the second stair region 1422*f* can be exposed so as to form the first stair portion 102*f* and the second stair portion 104*f* of the micro semiconductor stacked structure 10*f* as shown in FIG. 10B. Accordingly to the configuration of the first stair portion 102*f* and the second stair portion 104*f*, the electronic connecting member 18*f* can be formed to electrically connect the conductive pattern layers of any two of the stacked structure array units by wire bonding. Furthermore, an external electronic control structure 300*f* is connected to the conductive pattern layer 1440*f* of the first stacked structure array unit 120*f*, thereby achieving the electronic apparatus 200*f*, which is a color display unit. The external electronic control structure 300*f* can be provided in one step after stacking the above-mentioned stacked structure array units 120*f*, 140*f* and 160*f*. For example, the external electronic control structure 300*f* comprises a connecting board and a circuit board including the control IC. To be noted, the external electronic control structure 300*f* shown in this embodiment is for a simple illustration. The external electronic control structure 300*f* may only electrically connect to the electronic connecting member 18*f* of a specific layer, and then further drive all conductive pattern layers of the micro semiconductor stacked structure 10*f*.

Figure 11:
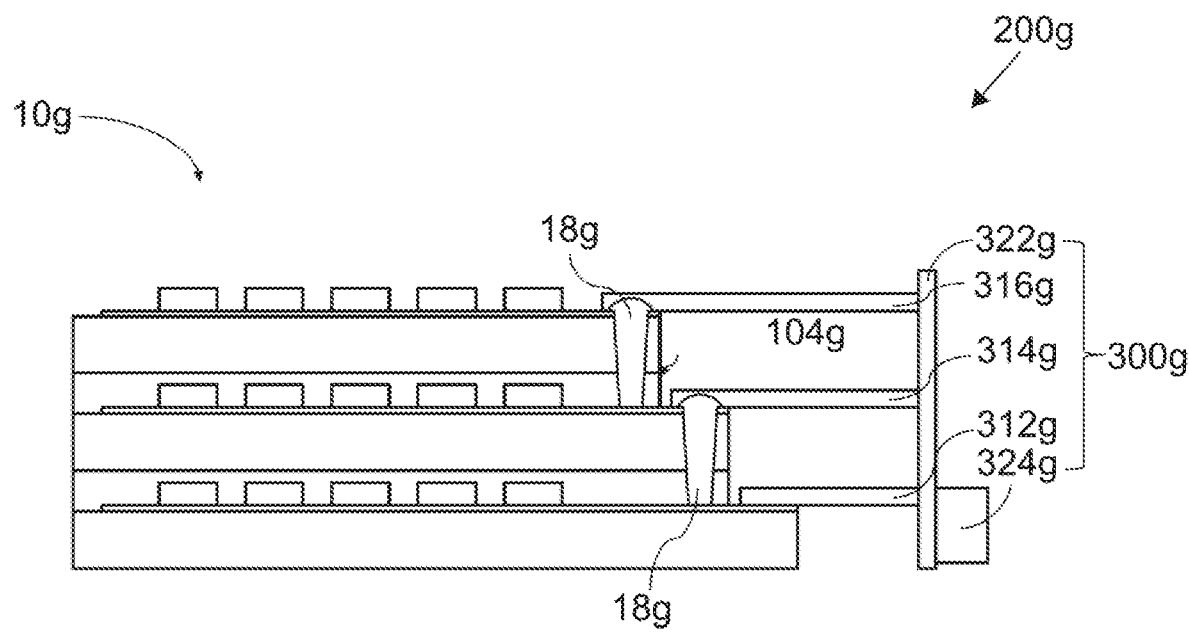
FIG. 11 is a schematic diagram showing the structure of the electronic apparatus comprising the micro semiconductor stacked structure according to the eighth embodiment of this disclosure.

Different from the seventh embodiment, in the eighth embodiment of FIG. 11, the electronic connecting member 18*g* of the micro semiconductor stacked structure 10*g* is connected to an external electronic control structure 300*g*. In this embodiment, the electronic connecting member 18*g* is formed by filling the through hole. The external electronic control structure 300*g* comprises first electronic control members 312*g*, 314*g* and 316*g* connecting to the substrates of the stacked structure array units 120*g*, 140*g* and 160*g*, and a second electronic control member 322*g*, which comprises a control IC 324*g* and connects to the first electronic control members 312*g*, 314*g* and 316*g*. This embodiment indicates another aspect of the external electronic control structure, and the implement of the external electronic control structure is not limited thereto. For example, multiple external electronic control structures are formed corresponding to each of the stacked structure array units, or only one external electronic control structure is formed corresponding to one of the stacked structure array units. In addition, the first electronic control members 312*g*, 314*g* and 316*g* can be connected to the second electronic control members 322*g* with the control ICs 324*g*, respectively. In this embodiment, the external electronic control structure can be electrically connected to at least one electronic connecting member for driving the conductive pattern layer of the micro semiconductor stacked structure.

Figure 12:
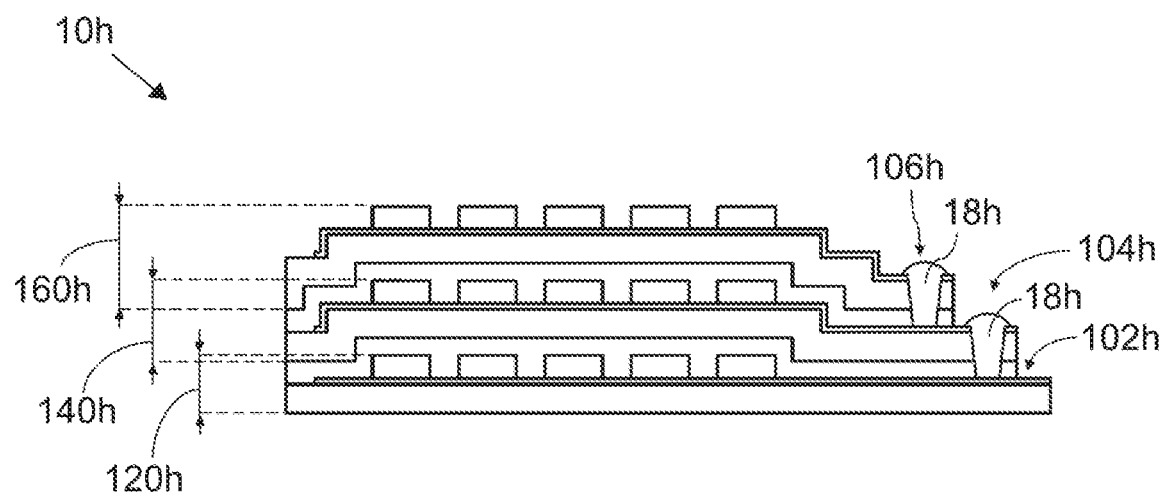
FIG. 12 is a schematic diagram showing the structure of the electronic apparatus comprising the micro semiconductor stacked structure according to the ninth embodiment of this disclosure.

The ninth embodiment of FIG. 12 discloses an aspect of the micro semiconductor stacked structure 10*h* adopting the design of stacked structure array units as unit layers based on the third embodiment. The substrates of the stacked structure array units 120*h*, 140*h* and 160*h* are flexible transparent substrates, so that the first stair portion 102*h*, the second stair portion 104*h* and the third stair portion 106*h* can be formed based on the surface profiles of the corresponding stacked structure array units. In this embodiment, the electrical connection of two of the stacked structure array units can be implemented by the electronic connecting member 18*h*, which is formed by filling the through holes in the above-mentioned stair portions.

Figure 13:
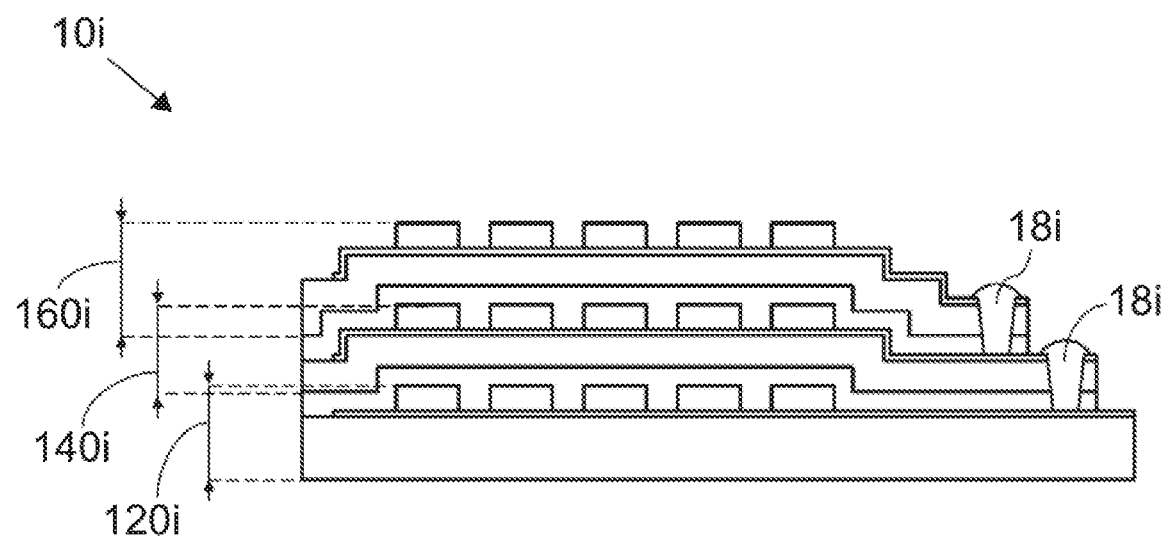
FIG. 13 is a schematic diagram showing the structure of the electronic apparatus comprising the micro semiconductor stacked structure according to the tenth embodiment of this disclosure.

The tenth embodiment of FIG. 13 discloses an aspect of the micro semiconductor stacked structure 10*i* adopting the design of stacked structure array units as unit layers based on the fourth embodiment. The substrate of the stacked structure array unit 120*i* is a rigid transparent substrates, and the substrates of the stacked structure array units 140*i* and 160*i* are flexible transparent substrates. Thus, the stair portions can be formed based on the surface profiles of the corresponding stacked structure array units. In this embodiment, the electrical connection of two of the stacked structure array units can be implemented by the electronic connecting member 18*i*, which is formed by filling the through holes in the above-mentioned stair portions.

Figure 14:
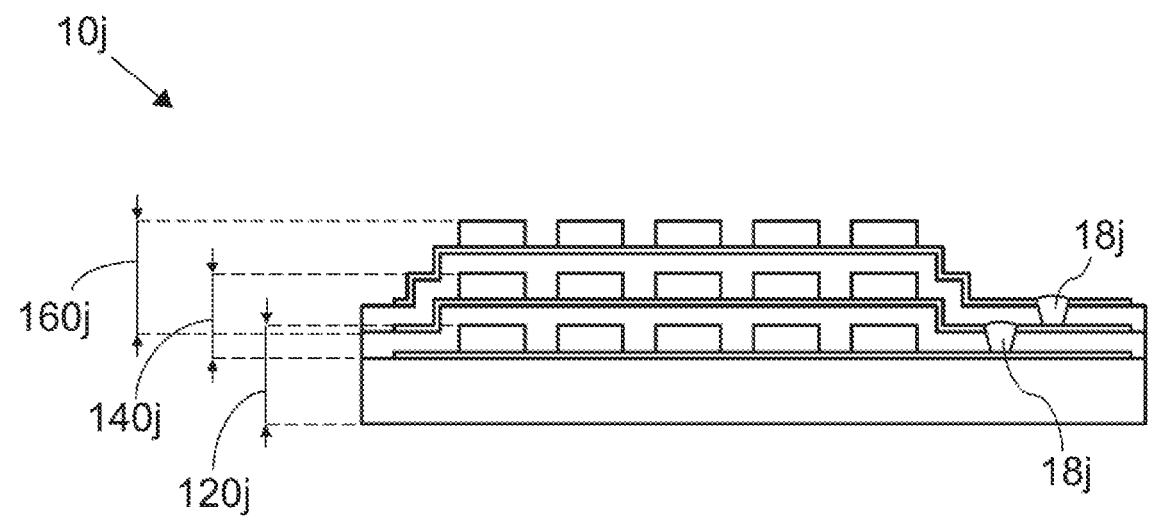
FIG. 14 is a schematic diagram showing the structure of the electronic apparatus comprising the micro semiconductor stacked structure according to the eleventh embodiment of this disclosure.

The eleventh embodiment of FIG. 14 discloses an aspect of the micro semiconductor stacked structure 10*j* based on the fifth embodiment. Similar to the fifth embodiment, the seventh embodiment is to prepare the substrate of the first stacked structure array unit 120*j*, and then to form the stacked structure array units 120*j*, 140*j* and 160*j* by the semiconductor manufacturing processes. In this embodiment, the electrical connection of two of the stacked structure array units can be implemented by the electronic connecting member 18*j*, which is formed by filling through holes in the semiconductor manufacturing processes.

The considered or adopted materials, steps and the corresponding benefits in the first to fifth embodiments can be applied to the sixth to eleventh embodiments.

Benefit Effects

The semiconductor stacked structure and the electronic apparatus comprising the same of this disclosure at least have the following benefit effects:

1. Regarding the micro semiconductor stacked structure of this disclosure, a plurality of micro semiconductor devices are stacked along the vertical direction, and the electricity functions of the semiconductor devices can be maintained, thereby effectively and sufficiently decreasing the pixel area.

2. Regarding the electronic apparatus of this disclosure, the amount of the micro semiconductor device within the limited area can be calculated by dividing the limited area by the unit area. That is, the possible amount of the micro semiconductor devices (e.g. the amount of the micro LED chips) is: (limited area/unit area)*layers. In other words, the pixel density within the limited area of this disclosure is a multiple of the conventional micro LED display technology of FIG. 1.

3. Regarding the micro semiconductor stacked structure and the electronic apparatus comprising the same, under the condition of the same limited area as the conventional micro LED display technology of FIG. 1, the pixel density is increased, such as the 3.5″ VR or AR display (2000 ppi) composed of the micro LED chips. Thus, the electronic apparatus of this disclosure can achieve low cost and high resolution with the same limited area.

4. Regarding the micro semiconductor stacked structure, the stacked order of the stacked structures of this disclosure can be either limited or not according to the properties of the micro semiconductor devices, and this disclosure is to align the target regions (e.g. pixels) only.

5. All embodiments of this disclosure can adopt the redundancy mechanism, which is to prepare the additional (redundant) micro semiconductor device in a single target region of each stacked structure/stacked structure array unit. For example, two micro LED chips of the same color are configured in a single pixel. This configuration can decrease the risk of the failure of the single target region, thereby improving the manufacturing yield of this disclosure.

6. This disclosure can be flexibly applied to the existing manufacturing processes. Regarding the micro semiconductor stacked structures of the first to fifth embodiments, the stacked structures can be separately manufactured and then the required stacked structures are selected to form the micro semiconductor stacked structure (first to third embodiments); or the conductive pattern layer can be formed on the substrate by the semiconductor manufacturing processes, the micro semiconductor devices are disposed on the substrate, and the semiconductor manufacturing processes are repeated to form the stacked structures in order, thereby forming the micro semiconductor stacked structure (fourth embodiment). Similarly, in the embodiments of the stacked structure array units as the unit layers, the conductive pattern layer can be formed on the substrate by the semiconductor manufacturing processes, the micro semiconductor devices are disposed on the substrate, and the stacked structure array units are stacked to form the micro semiconductor stacked structure.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A micro semiconductor stacked structure, comprising:
   at least two stacked structures, wherein one of the stacked structures is stacked on the other one of the stacked structures, wherein:
   the one of the stacked structures is stacked on the other one of the stacked structures along a vertical direction;
   each of the stacked structures comprises a substrate, a conductive pattern layer disposed on the substrate, and one or more micro semiconductor devices disposed on the substrate and electrically connected to the conductive pattern layer;
   each of the stacked structures defines a target region, and at least one of the micro semiconductor devices is disposed in the target region;
   between two of the stacked structures, the target regions are aligned along the vertical direction; and
   in at least one of the stacked structures, the conductive pattern layer is an active circuit.

2. The micro semiconductor stacked structure of claim 1, further comprising at least
   one stair portion, wherein:
   the at least one stair portion is formed based on sizes of the substrates decreasing sequentially along a direction toward an upper one of the stacked structures or away from a lower one of the stacked structures.

3. The micro semiconductor stacked structure of claim 1, wherein:
   the conductive pattern layers of the two of the stacked structures are connected by an electronic connecting member.

4. The micro semiconductor stacked structure of claim 2, wherein:
   the at least one stair portion comprises an electronic connecting member, and the conductive pattern layers of the two of the stacked structures are connected by the electronic connecting member.

5. The micro semiconductor stacked structure of claim 1, wherein:
   a size of the micro semiconductor device is 1-50 μm.

6. The micro semiconductor stacked structure of claim 1, wherein:
   the substrates of the stacked structures are transparent; or the substrate of the bottommost stacked structure is nontransparent.

7. The micro semiconductor stacked structure of claim 1, wherein:
   the conductive pattern layer of the bottommost stacked structure is an active circuit configured with a TFT switch or a MOS switch.

8. The micro semiconductor stacked structure of claim 1, wherein:
   the micro semiconductor device of each of the stacked structures is a micro LED chip, a micrometer photo detector chip, or a combination thereof.

9. The micro semiconductor stacked structure of claim 1, wherein:
   the two of the stacked structures are bonded by an adhesive material.

10. An electronic apparatus, comprising:
    a plurality of micro semiconductor stacked structures of claim 1 arranged in an array; and
    at least one external electronic control structure electrically connected to the conductive pattern layer of at least one of the stacked structures.

11. A micro semiconductor stacked structure, comprising:
    at least two stacked structure array units, wherein one of the stacked structure array units is stacked on the other one of the stacked structure array units, wherein:
    the one of the stacked structure array units is stacked on the other one of the stacked structure array units along a vertical direction, each of the stacked structure array units comprises a substrate, a conductive pattern layer disposed on the substrate, and a plurality of micro semiconductor devices disposed on the substrate, arranged in an array, and electrically connected to the conductive pattern layer;
    each of the conductive pattern layers comprises a matrix circuit, and the micro semiconductor devices are electrically connected to the matrix circuit;
    each of the stacked structure array units is defined with a plurality of target regions arranged in an array; and in each of the stacked structure array units, at least one of the micro semiconductor devices is correspondingly disposed in one of the target regions;

between two of the stacked structure array units, the target regions of an upper one of the stacked structure array units are aligned to the target regions of a lower one of the stacked structure array units, respectively, along the vertical direction; and in at least one of the stacked structure array units, the matrix circuit of the conductive pattern layer is an active matrix circuit.

12. The micro semiconductor stacked structure of claim 11, further comprising at least one stair portion, wherein:

the at least one stair portion is formed based on sizes of the substrates decreasing sequentially along a direction toward the upper one of the stacked structure array units or away from the lower one of the stacked structure array units.

13. The micro semiconductor stacked structure of claim 11, wherein:

in two of the stacked structure array units, the conductive pattern layers of the upper one of the stacked structure array units are connected to the conductive pattern layers of the lower one of the stacked structure array units by at least one electronic connecting member.

14. The micro semiconductor stacked structure of claim 12, wherein:

the at least one stair portion comprises an electronic connecting member, and in two of the stacked structure array units, the conductive pattern layers of the upper one of the stacked structure array units are connected to the conductive pattern layers of the lower one of the stacked structure array units by the electronic connecting member.

15. The micro semiconductor stacked structure of claim 11, wherein:

a size of each of the micro semiconductor devices is 1-50 µm.

16. The micro semiconductor stacked structure of claim 11, wherein:

the substrates of the stacked structure array units are transparent; or the substrate of the bottommost stacked structure array unit is nontransparent.

17. The micro semiconductor stacked structure of claim 11, wherein:

the two of the stacked structure array units are bonded by an adhesive material.

18. The micro semiconductor stacked structure of claim 11, wherein:

the conductive pattern layer of the bottommost stacked structure array unit is an active matrix circuit configured with a TFT switch or a MOS switch.

19. The micro semiconductor stacked structure of claim 11, wherein:

the micro semiconductor device of each of the stacked structure array units is a micro LED chip, a micrometer photo detector chip, or a combination thereof.

* * * * *